(12) United States Patent
Ueyama

(10) Patent No.: US 12,099,077 B2
(45) Date of Patent: Sep. 24, 2024

(54) SOCKET

(71) Applicant: Enplas Corporation, Saitama (JP)

(72) Inventor: Yuki Ueyama, Saitama (JP)

(73) Assignee: Enplas Corporation, Saitama (JP)

( * ) Notice: Subject to any disclaimer, the term of this patent is extended or adjusted under 35 U.S.C. 154(b) by 141 days.

(21) Appl. No.: 17/759,043

(22) PCT Filed: Dec. 17, 2020

(86) PCT No.: PCT/JP2020/047120
§ 371 (c)(1),
(2) Date: Jul. 19, 2022

(87) PCT Pub. No.: WO2021/149417
PCT Pub. Date: Jul. 29, 2021

(65) Prior Publication Data
US 2023/0038252 A1    Feb. 9, 2023

(30) Foreign Application Priority Data

Jan. 21, 2020   (JP) .................................. 2020-007599

(51) Int. Cl.
*G01R 31/00* (2006.01)
*G01R 1/04* (2006.01)

(52) U.S. Cl.
CPC ......... *G01R 1/0466* (2013.01); *G01R 1/0483* (2013.01)

(58) Field of Classification Search
CPC .. G01R 1/0466; G01R 1/0483; G01R 1/2863; G01R 1/2891; H01R 33/76
See application file for complete search history.

(56) References Cited

U.S. PATENT DOCUMENTS

| 5,320,550 A | * | 6/1994 | Uratsuji | ............... | H05K 7/1061 |
| | | | | | 439/330 |
| 7,491,082 B2 | * | 2/2009 | Hsu | ...................... | G01R 1/0466 |
| | | | | | 439/330 |

(Continued)

FOREIGN PATENT DOCUMENTS

| JP | 11-026123 A | 1/1999 |
| JP | H1126123 * | 1/1999 |

(Continued)

OTHER PUBLICATIONS

International Search Report of PCT/JP2020/047120 dated Mar. 9, 2021.

*Primary Examiner* — Thang X Le
(74) *Attorney, Agent, or Firm* — Shih IP Law Group, PLLC

(57) ABSTRACT

A socket for electrically connecting a first electrical component, the upper surface of which is pressed upon by a pressing member, and a second electrical component which is positioned below the first electrical component, said socket being equipped with: a socket main body which has a placement surface on which the first electrical component is placed; and a holding part which is provided to the socket main body, holds the first electrical component to the socket main body by engaging the first electrical component in a pressed state in which the first electrical component is pressed upon by the pressing member, and releases the engagement with the first electrical component when the pressing member moves a prescribed distance away from the position which corresponds to the pressed state.

6 Claims, 8 Drawing Sheets

(56) References Cited

U.S. PATENT DOCUMENTS

| | | | | |
|---|---|---|---|---|
| 2002/0177347 A1* | 11/2002 | Ogura | ................ | H01R 13/2421 |
| | | | | 439/330 |
| 2008/0207036 A1* | 8/2008 | Hwang | ................ | G01R 1/0483 |
| | | | | 439/331 |
| 2009/0088006 A1* | 4/2009 | Uratsuji | ............... | G01R 1/0466 |
| | | | | 439/66 |
| 2019/0346483 A1 | 11/2019 | Nakashima | | |

FOREIGN PATENT DOCUMENTS

| JP | 2004-014470 A | 1/2004 |
|---|---|---|
| JP | 2007-109534 A | 4/2007 |
| JP | 2019-196937 A | 11/2019 |

* cited by examiner

SOCKET

TECHNICAL FIELD

The present invention relates to a socket used for a performance test or the like for an electrical component such as a semiconductor device (hereinafter referred to as an "IC package").

BACKGROUND ART

Conventionally, for example, an IC socket (hereinafter, simply referred to as a "socket") has been known as a socket for housing an electrical component such as an IC package for external electrical connection (see, for example, Patent Literature (hereinafter, referred to as "PTL") 1). The socket is used to inspect the electrical characteristics of the electrical component during inspection of the electrical component for shipping.

In a used state, the socket is disposed between the IC package to be tested and an inspection board. Then, in order to ensure electrical connection with the inspection board, the IC package is pressed toward the inspection board by a pressing member.

CITATION LIST

Patent Literature

PTL 1
Japanese Patent Application Laid-Open No. 2019-196937

SUMMARY OF INVENTION

Technical Problem

In the case of the socket as described above, the IC package can unintentionally be attached to a pressing surface of the pressing member and the work of peeling the IC package from the pressing surface can be required when taking out the IC package from the socket. Such an operation is troublesome and causes a decrease in the work efficiency of the performance test.

It is an object of the present invention to provide a socket capable of improving work efficiency.

Solution to Problem

One aspect of a socket according to the present invention is a socket for electrically connecting a first electrical component to a second electrical component, the first electrical component being pressed at an upper surface of the first electrical component by a pressing member, the second electrical component being disposed below the first electrical component, the socket including:
a socket body including a mounting surface on which the first electrical component is to be placed; and
a holding part that is disposed on the socket body and that, in a pressed state in which the first electrical component is pressed by the pressing member, is engaged with the first electrical component to hold the first electrical component, and releases engagement with the first electrical component when the pressing member is separated by a predetermined distance away from a position corresponding to the pressed state.

Advantageous Effects of Invention

According to the present invention, work efficiency can be improved.

DESCRIPTION OF EMBODIMENTS

Hereinafter, embodiments of the present invention will be described in detail with reference to the drawings. Note that a socket according to the embodiment described later is one example of the socket according to the present invention, and the present invention is not limited by the embodiment.
[Embodiments]
Hereinafter, socket S according to the present embodiment will be described with reference to FIGS. 1 to 11.

Figure 1:
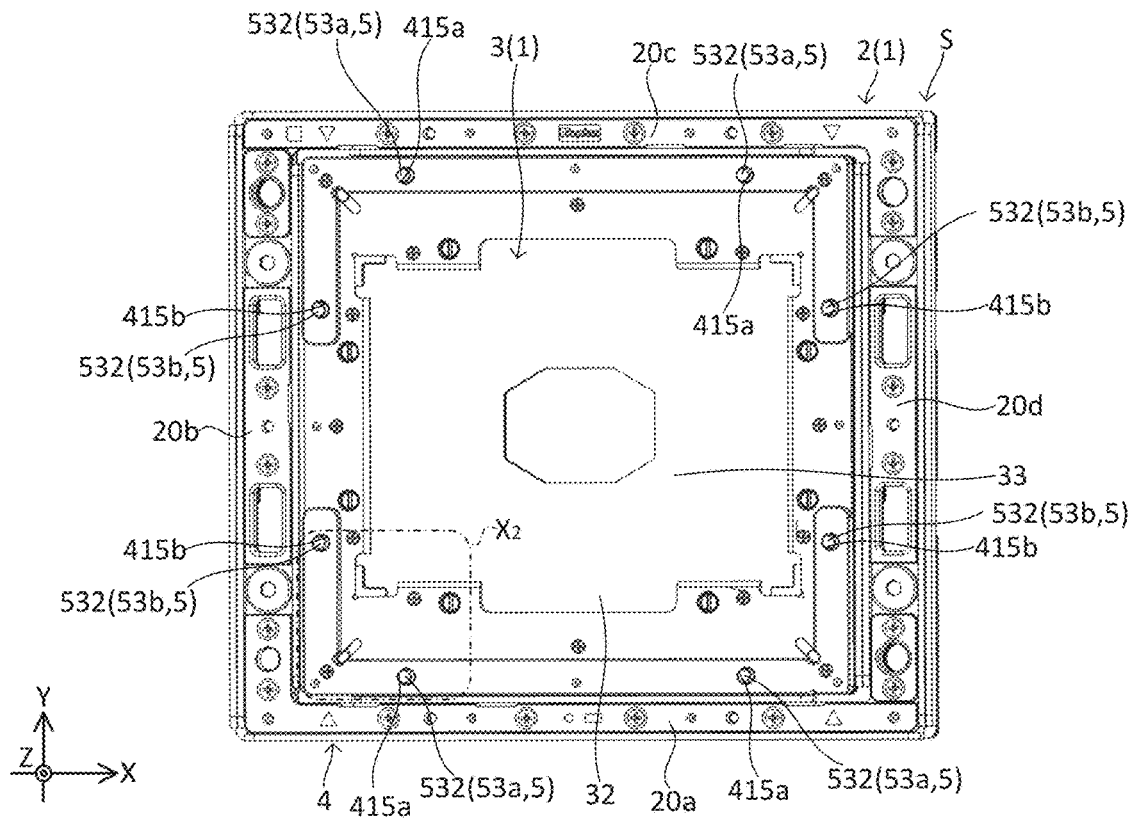
FIG. 1 is a plan view of a socket according to an embodiment that corresponds to a non-holding state.
Figure 2:
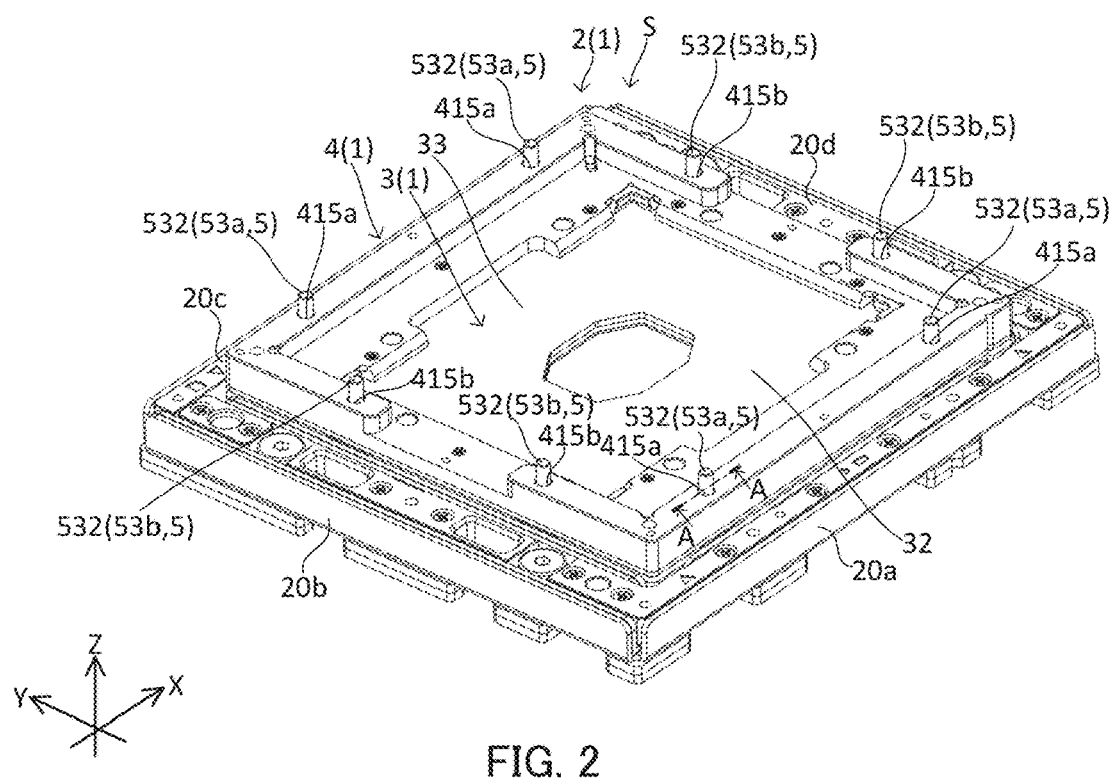
FIG. 2 is a perspective view of the socket corresponding to the non-holding state.

As illustrated in FIGS. 1 and 2, the present embodiment will be described using an orthogonal coordinate system (X, Y, Z). The orthogonal coordinate system (X, Y, Z) illustrated in below-mentioned figures is common to the orthogonal coordinate systems (X, Y, Z) illustrated in the other figures.

The X direction in the orthogonal coordinate system (X, Y, Z) corresponds to the lateral direction of socket S. In addition, the Y direction in the orthogonal coordinate system (X, Y, Z) corresponds to the longitudinal direction of socket S. In addition, the Z direction in the orthogonal coordinate system (X, Y, Z) corresponds to the height direction of socket S. The lateral direction of socket S and the longitudinal direction of socket S may be interchanged.

The Z-direction in the orthogonal coordinate system (X, Y, Z) also corresponds to the vertical direction of socket S. The + side in the Z direction corresponds to the upper side of inspection socket 1A, and the − side in the Z direction corresponds to the lower side of socket S.

Further, in the following description, in the plan view shapes of socket S and elements constituting socket S, a corner portion on the − side in the X direction and on the − side in the Y direction is referred to as a first corner portion, a corner portion on the − side in the X direction and on the + side in the Y direction is referred to as a second corner portion, a corner portion on the + side in the X direction and on the + side in the Y direction is referred to as a third corner portion, and a corner portion on the + side in the X direction and on the − side in the Y direction is referred to as a fourth corner portion.

<Socket>

Figure 8:
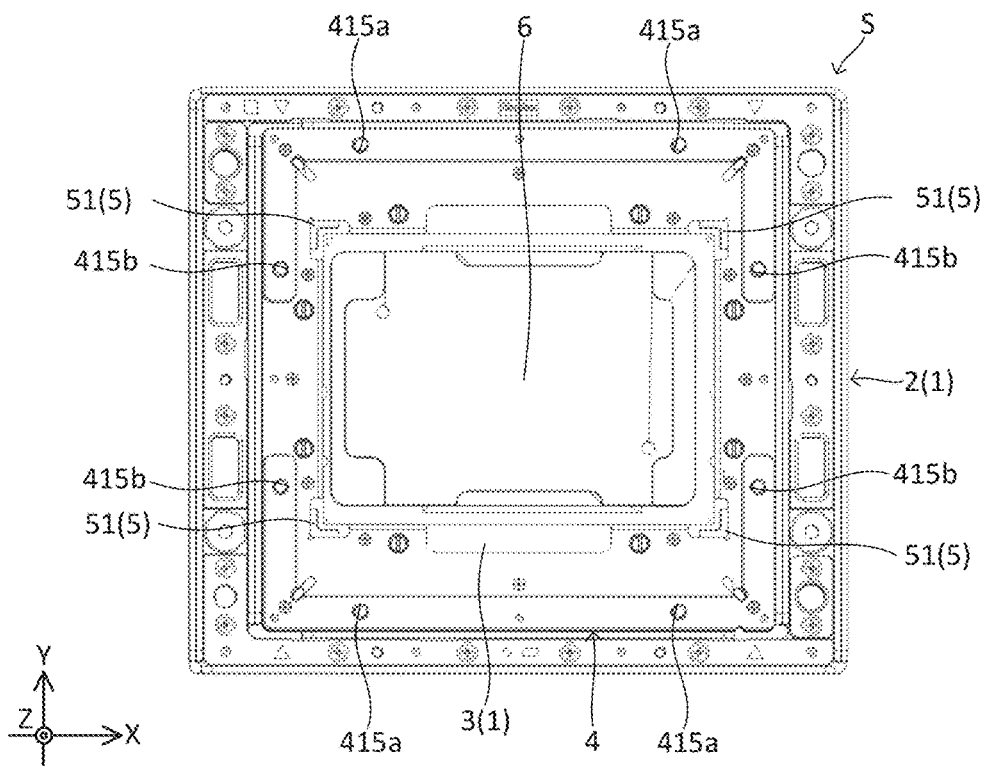
FIG. 8 is a plan view of the socket and an IC package corresponding to the non-holding state.
Figure 9:
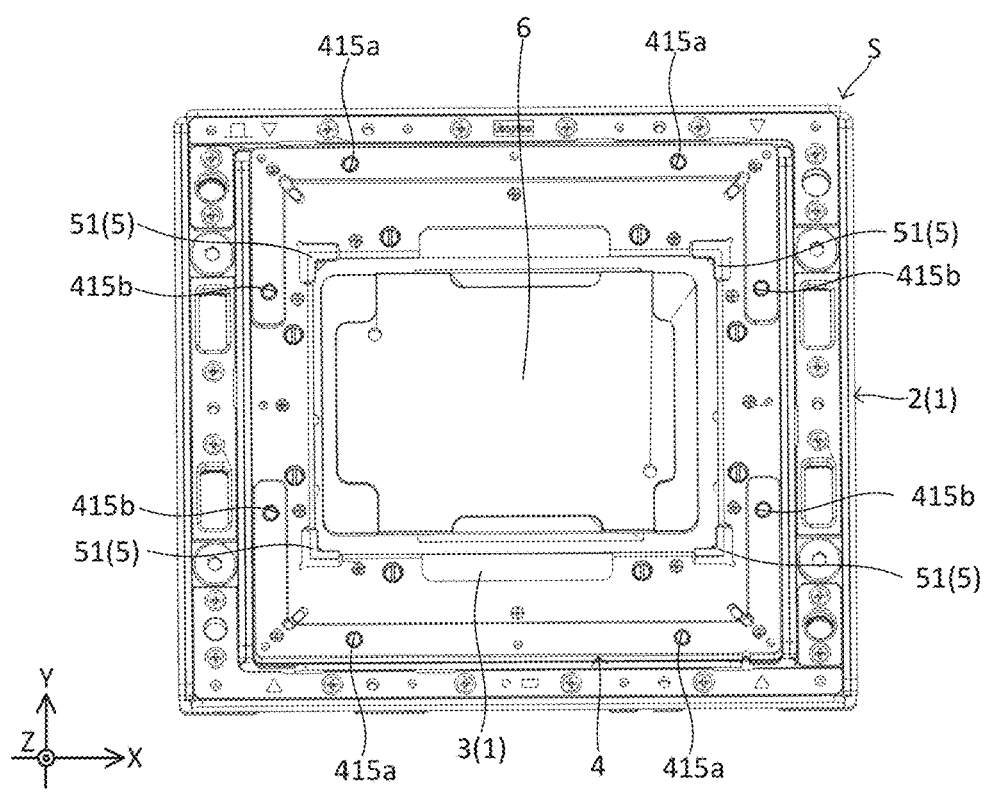
FIG. 9 is a plan view of the socket and the IC package corresponding to the holding state.

Socket S is used to electrically connect together IC package 6 and inspection board 7 (see FIG. 11) during inspection of an electrical component such as IC package 6 (see FIGS. 8 and 9).

In the present embodiment, IC package 6 corresponds to one example of the first electrical component. Inspection board 7 corresponds to one example of the second electrical component. Inspection board 7 may correspond to one example of the first electrical component, and IC package 6 may correspond to one example of the second electrical component.

A plurality of package-side terminals are disposed on the lower surface of IC package 6 in a matrix shape. The package-side terminals are, for example, solder balls. Further, a plurality of board-side terminals are disposed on the upper surface of inspection board 7 in a matrix shape.

Figure 11:
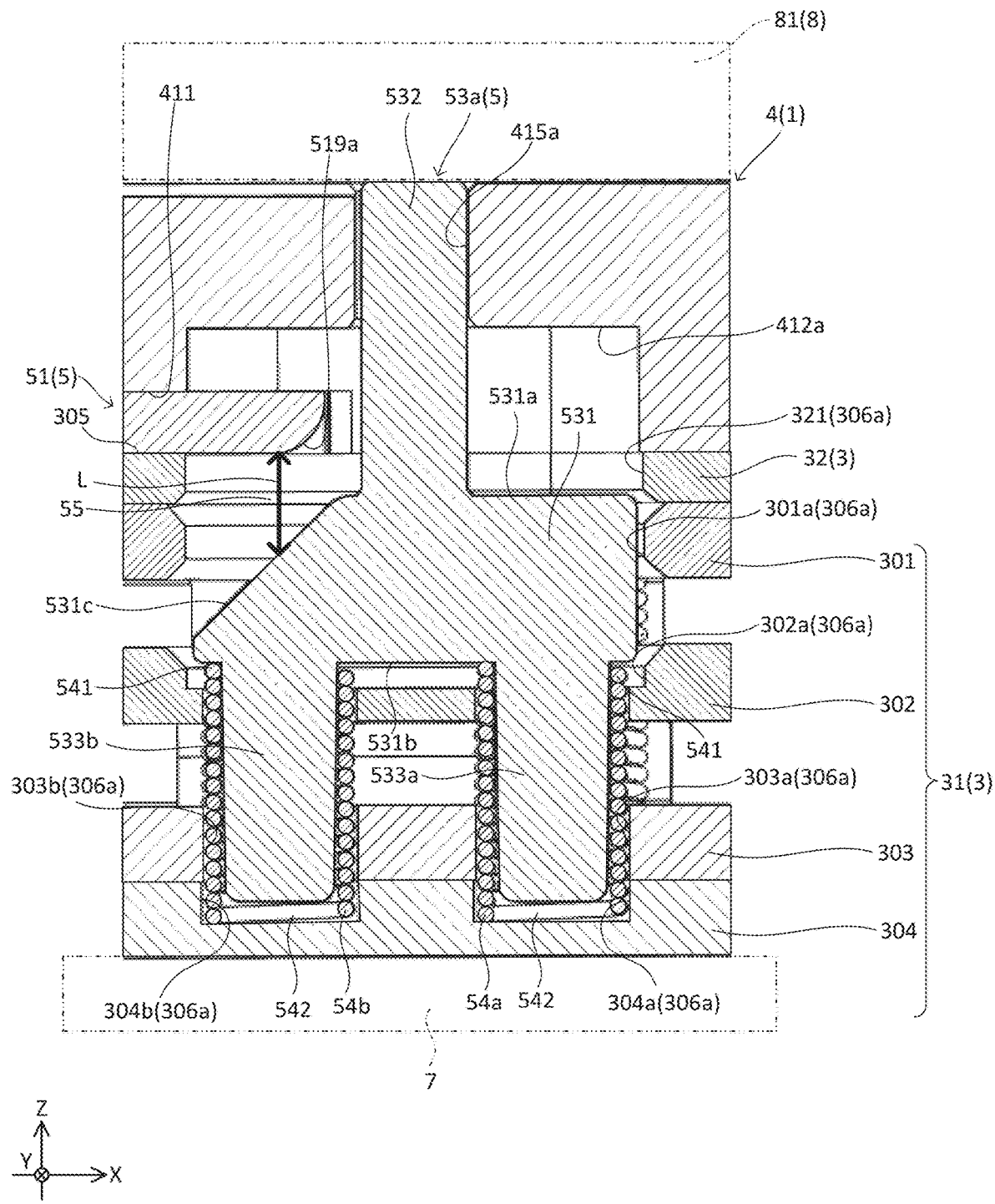
FIG. 11 is an A-A sectional view of the socket along line A-A in FIG. 2 corresponding to the holding state.

In the following description, the state of socket S used for the inspection, that is, the state illustrated in FIGS. 9 and 11, is also referred to as the used state of socket S. In the used state of socket S, socket S is disposed on inspection board 7 in a state of housing IC package 6.

In the used state of socket S, IC package 6 is pressed downward by pressing member 81 (see FIG. 11). Therefore, the used state of socket S is also a pressed state in which IC package 6 is pressed by pressing member 81.

Further, a state in which socket S and IC package 6 is not pressed downward by pressing member 81 (the state illustrated in FIGS. 8 and 10) is also referred to as a non-used state and a non-pressed state of socket S.

In the present embodiment, pressing member 81 is disposed on pressing device 8 disposed above IC package 6 (see FIG. 11). That is, pressing member 81 is disposed on a different member from socket S. However, the pressing member may be disposed on the socket.

Socket S includes socket body 1 disposed on inspection board 7, holding mechanism 5, and contact pins (not illustrated).

Socket S may be various sockets. Although not illustrated, socket S may include a cover member disposed on socket body 1 to be openable/closable and configured to cover a housing portion housing the socket body from above in the used state of the socket. Further, socket S may include a pressing member supported by the cover member and configured to press IC package 6 downward in the used state of the socket.

<Socket Body>

Socket body 1 as seen in plan view, as illustrated in FIG. 1, has a rectangular outer shape, for example. Such a socket body 1 includes sidewall portion 2, plate portion 3, and vertical wall portion 4.

<Sidewall Portion>

Sidewall portion 2 forms the outer shape of socket body 1. Sidewall portion 2 includes first wall portion 20a, second wall portion 20b, third wall portion 20c, and fourth wall portion 20d that are connected to one another in a rectangular frame shape.

First wall portion 20a and third wall portion 20c extend in the X direction in parallel with each other. Third wall portion 20c is disposed on the + side of first wall portion 20a in the Y direction.

Second wall portion 20b and fourth wall portion 20d extend in the Y direction in parallel with each other. Fourth wall portion 20d is disposed on the on the + side of second wall portion 20b in the X direction.

Although a detailed description is omitted, sidewall portion 2 is formed by combining a plurality of members. Such a sidewall portion 2 supports plate portion 3 to be described later.

Plate portion 3 has a rectangular plate shape and is disposed in a space surrounded by sidewall portion 2. Plate portion 3 is supported by sidewall portion 2.

Plate portion 3 includes fixed portion 31 and movable portion 32.

<Fixed Portion>

Fixed portion 31 has a rectangular plate shape, and is fixed to sidewall portion 2 by a fixing means such as a fastening component. Therefore, fixed portion 31 is immovable with respect to sidewall portion 2.

Fixed portion 31 is composed of a plurality of plate-like members disposed to face one another in the vertical direction. Specifically, fixed portion 31 includes first plate 301, second plate 302, third plate 303, and fourth plate 304 in this order from the top.

First plate 301, second plate 302, third plate 303, and fourth plate 304 are connected by fastening components such as bolts to be spaced apart from one another in the vertical direction. The number of plates constituting fixed portion 31 is not limited to that in the case of the present embodiment. Fixed portion 31 may be composed of a single plate.

<Movable Portion>

Movable portion 32 has a rectangular plate shape, and is disposed above first plate 301 of fixed portion 31 to face fixed portion 31. Movable portion 32 is supported by fixed portion 31 to be movable in the vertical direction with respect to fixed portion 31.

Specifically, the movement of movable portion 32 is guided in the vertical direction by a plurality of guide members (not illustrated). The guide members are fixed to fixed portion 31 (specifically, to fourth plate 304), and are inserted through fixed portion 31 (specifically, through first plate 301, second plate 302, and third plate 303) and movable portion 32.

A plurality of elastic members such as coil springs (not illustrated) are disposed between movable portion 32 and fixed portion 31. The elastic members are in a free state when the socket is in the non-used state (non-pressed state). When IC package 6 is pressed downward by pressing member 81, the elastic members are contracted and movable portion 32 moves downward.

The elastic members apply an upward elastic force to movable portion 32 in the used state of the socket (pressed state). When IC package 6 is released from being pressed by pressing member 81, the elastic members are extended. As a result, movable portion 32 moves upward.

<Specific Configuration of Plate Portion>

Figure 3A:
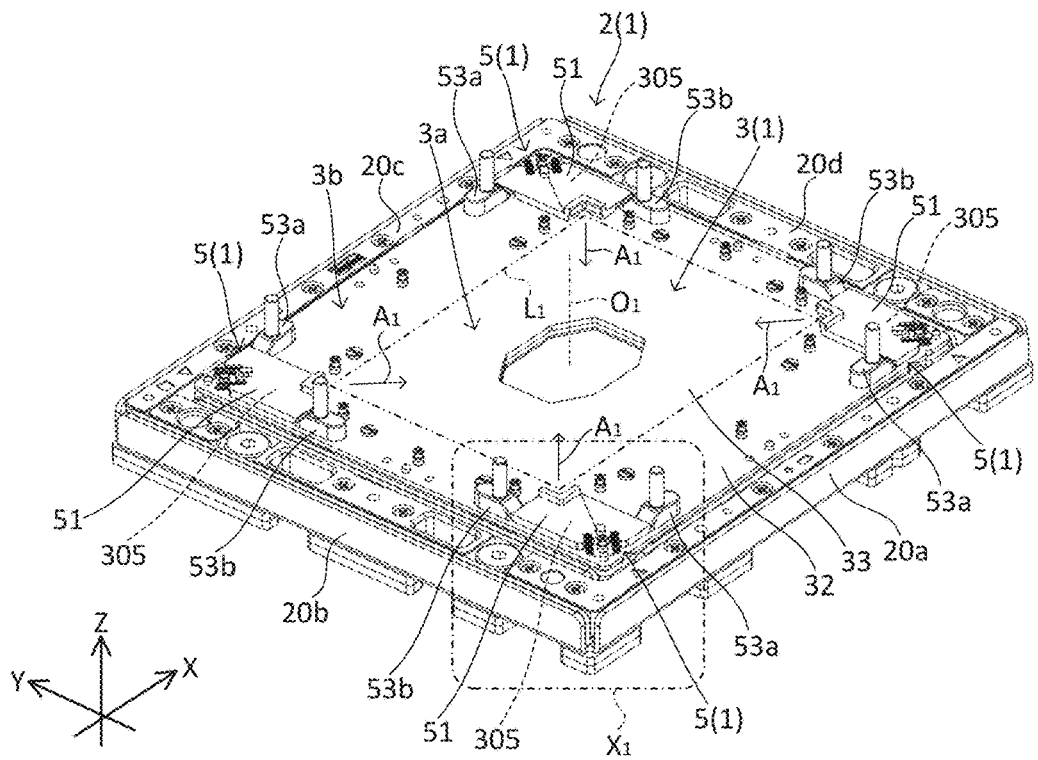
FIG. 3A is a perspective view of the socket corresponding to the non-holding state, in which illustration of a vertical wall portion is omitted.

Plate portion 3 includes first region 3a (rectangular inner region indicated by double-dot dashed line Li in FIG. 3A) and, second region 3b (rectangular outer region indicated by double-dot dashed line Li in FIG. 3A).

First region 3a is a rectangular region including a central portion in a plan view. First region 3a may be regarded as a three-dimensional region.

First region 3a forms a contact portion. First region 3a includes a plurality of through holes (not illustrated) extending through plate portion 3 in the vertical direction. The plurality of through holes hold contact pins (not illustrated), respectively.

The upper surface of first region 3a (contact portion) serves as mounting surface 33. IC package 6 is placed on mounting surface 33 in the used state.

In the used state of the socket, the contact portion electrically connect together IC package 6 placed on mounting surface 33 and inspection board 7 placed below the contact portion (see FIG. 11) via the contact pins.

Second region 3b as seen in plan view is a rectangular frame-shaped region surrounding first region 3a. Specifically, second region 3b is a rectangular outer region of plate portion 3 indicated by double-dot dashed line Li in FIG. 3A. Second region 3b may be regarded as a three-dimensional region.

Plate portion 3 (movable portion 32) includes, on the upper surfaces of the first corner portion, the second corner portion, the third corner portion, and the fourth corner portion in second region 3b, placement surfaces 305 for placing holding members 51 of holding mechanism 5 to be described later.

Plate portion 3 includes trigger holding portions 306a and 306b for holding trigger members 53a and 53b of holding mechanism 5, which will be described later. In the present embodiment, trigger holding portions 306a and 306b are disposed at each of the first corner portion, the second corner portion, the third corner portion, and the fourth corner portion in second region 3b.

Trigger holding portions 306a are disposed on placement surfaces 305 at positions adjacent to each other in the X direction. Trigger holding portions 306b are disposed on placement surfaces 305 at positions adjacent to each other in the Y direction.

Hereinafter, referring to FIGS. 3A, 10, and 11, the configuration of trigger holding portion 306a disposed on the first corner portion in second region 3b (hereinafter, simply referred to as "trigger holding portion 306a") will be described. The following description may be appropriately applied to other trigger holding portions 306a and 306b.

Trigger holding portion 306a includes, in the order from above, through hole 321 formed in movable portion 32, through hole 301a formed in first plate 301, through hole 302a formed in second plate 302, a pair of through holes 303a and 303b formed in third plate 303, and a pair of recesses 304a and 304b formed in fourth plate 304.

Through hole 321, through hole 301a, and through hole 302a are long holes extending in the X direction (in the Y direction in the case of trigger holding portions 306b). The major diameters of through hole 321, through hole 301a, and through hole 302a are parallel to the X direction (to the Y direction in the case of trigger holding portions 306b).

The short diameters of through hole 321, through hole 301a, and through hole 302a are parallel to the Y direction (to the X direction in the case of trigger holding portions 306b). Through hole 321, through hole 301a, and through hole 302a face one another in the vertical direction.

The pair of through holes 303a and 303b are formed adjacently to each other in the X direction (in the Y direction in the case of trigger holding portions 306b) in third plate 303 at positions facing through hole 321, through hole 301a, and through hole 302a in the vertical direction.

Recesses 304a and 304b are formed in fourth plate 304 adjacently to each other in the X direction (in the Y direction in the case of trigger holding portions 306b) at positions facing through holes 303a and 303b in the vertical direction.

Recess 304a faces through hole 303a in the vertical direction. Recess 304b faces through hole 303b in the vertical direction.

<Vertical Wall Portion>

Vertical wall portion 4 has a rectangular frame shape, and is disposed on the upper surface of plate portion 3 (movable portion 32) in second region 3b. Vertical wall portion 4 is disposed to protrude upward from the upper surface of plate portion 3 (movable portion 32).

Figure 5:
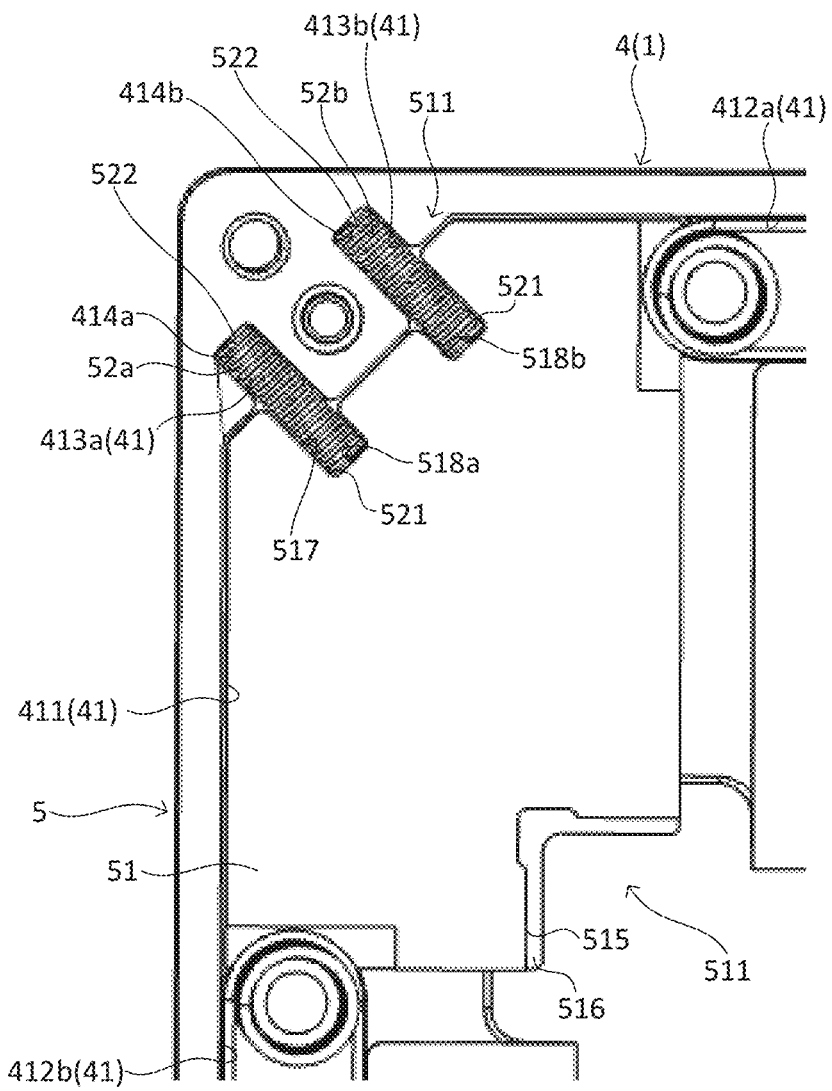
FIG. 5 is a bottom view of the vertical wall portion and a holding mechanism at a portion corresponding to an $X_2$ portion in FIG. 1.
Figure 5:
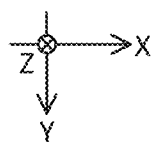
Figure 6:
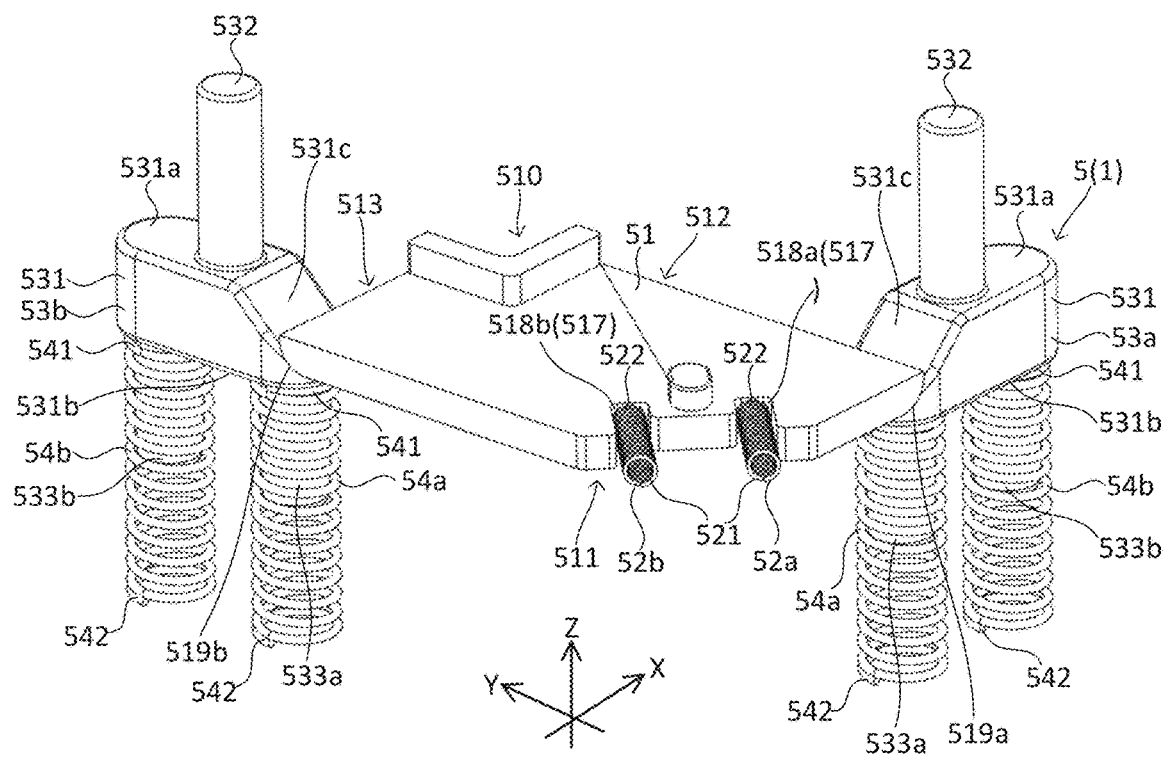
FIG. 6 is a perspective view illustrating only the holding mechanism taken out.
Figure 7:
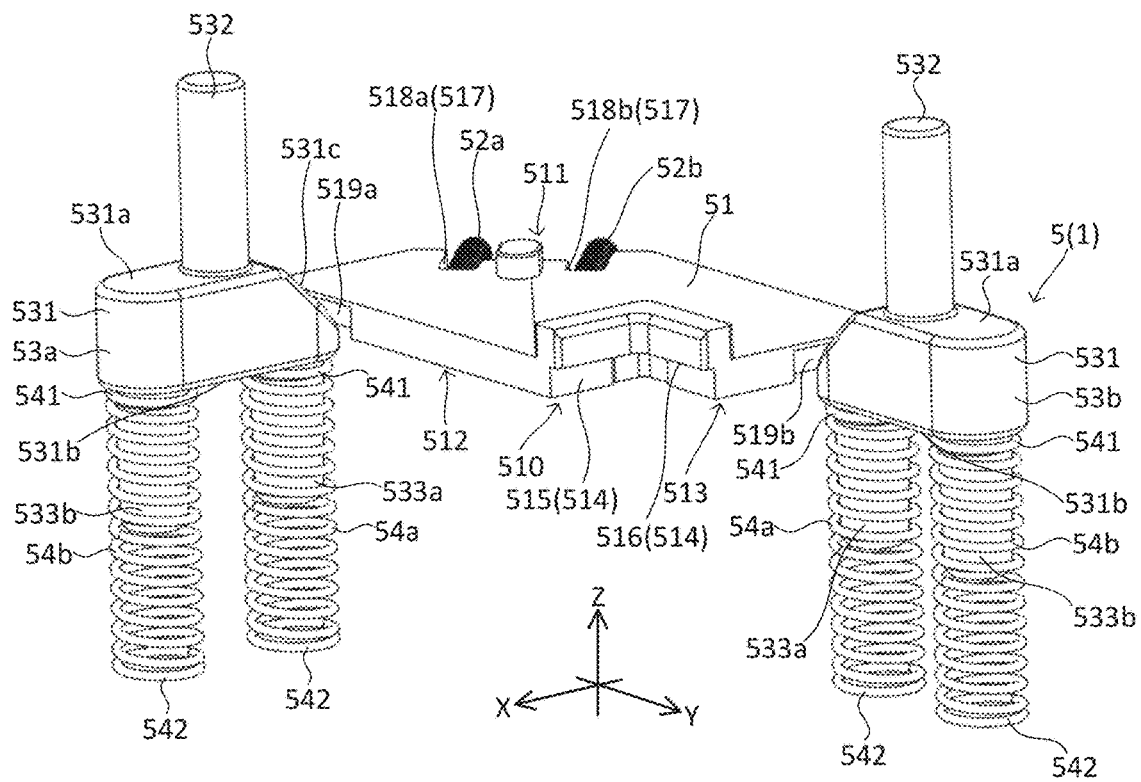
FIG. 7 is a perspective view of the holding mechanism as viewed from a different angle from FIG. 6.

Vertical wall portion 4 includes housing portions 41 for housing holding mechanism 5, which will be described later, in the first corner portion, the second corner portion, the third corner portion, and the fourth corner portion. FIG. 5 illustrates the structure of the first corner portion of vertical wall portion 4. The structures of the second corner portion, the third corner portion, and the fourth corner portion of vertical wall portion 4 are similar to the structure of the first corner portion of vertical wall portion 4 illustrated in FIG. 5.

Housing portion 41 includes first housing portion 411 (see FIG. 5) for housing holding part 51 of holding mechanism 5, second housing portions 412a and 412b (see FIG. 5) for housing trigger members 53a and 53b of holding mechanism 5, and third housing portions 413a and 413b (see FIG. 5) for housing first elastic members 52a and 52b of holding mechanism 5.

First housing portion 411 restricts the upward movement of holding part 51. Third housing portions 413a and 413b include receiving surfaces 414a and 414b that make contact with second end portions 522 of first elastic members 52a and 52b, respectively.

Vertical wall portion 4 includes through holes 415a and 415b through which upper shaft portions 532 of trigger members 53a and 53b of holding mechanism 5, which will be described later, are inserted. In the case of the present embodiment, through holes 415a and 415b are formed at two positions in each of the first corner portion, the second corner portion, the third corner portion, and the fourth corner portion of vertical wall portion 4.

Through hole 415a is formed in vertical wall portion 4 at a position facing trigger holding portion 306a of plate portion 3 in the vertical direction. Through hole 415b is formed in vertical wall portion 4 at a position facing trigger holding portion 306b of plate portion 3 in the vertical direction.

<Holding Mechanism>

Holding mechanism 5 is disposed in socket body 1. In the pressed state in which IC package 6 is pressed by pressing member 81, holding mechanism 5 is engaged with IC package 6 to come into a holding state in which the holding mechanism holds IC package 6 in socket body 1. When pressing member 81 is away from a position corresponding to the pressed state by a predetermined distance, the holding mechanism comes into a non-holding state in which the engagement with IC package 6 is released.

In the following description, the holding state means a state in which IC package 6 is held in socket body 1 by holding mechanism 5. The non-holding state means a state in which IC package 6 is not held in socket body 1 by holding mechanism 5.

Hereinafter, the holding state of holding mechanism 5 and the state of each element of holding mechanism 5 corresponding to the holding state of holding mechanism 5 are simply referred to as the holding state. The non-holding state of holding mechanism 5 and the state of each element of holding mechanism 5 corresponding to the non-holding state of holding mechanism 5 are simply referred to as the non-holding state.

In the case of the present embodiment, holding mechanism 5 is disposed at each of the first corner portion, the second corner portion, the third corner portion, and the fourth corner portion of second region 3b on the upper surface of plate portion 3 (movable portion 32). The number and arrangement of the holding mechanisms are not limited to those in the case of the present embodiment.

One holding mechanism may be enough as long as it can hold IC package 6 to socket body 1. As in the present embodiment, it is preferable that the holding mechanisms be disposed on the upper surface of plate portion 3 in at least two places (four places in the present embodiment) opposite each other in the direction parallel to mounting surface 33.

Hereinafter, holding mechanism 5 disposed in the first corner portion of plate portion 3 will be described. The structures of holding mechanisms 5 disposed in the second corner portion, the third corner portion, and the fourth corner portion of plate portion 3 are the same as the structure of holding mechanism 5 disposed in the first corner portion of plate portion 3.

Holding mechanism 5 includes holding member 51, first elastic members 52a and 52b, trigger members 53a and 53b, and second elastic members 54a and 54b.

<Holding Member>

Holding member 51 corresponds to one example of the holding part, and has a substantially rectangular plate shape. Holding member 51 is disposed on placement surface 305 of plate portion 3. Holding member 51 is movable between a first position corresponding to the non-holding state and a second position corresponding to the holding state.

The first position of holding member 51 is the position of holding member 51 illustrated in FIG. 3A. The second position of holding member 51 is the position of holding member 51 illustrated in FIG. 3B.

When moving from the first position to the second position, holding member 51 moves in the direction indicated by arrow $A_1$ in FIG. 3A (also referred to as the first moving direction). The first moving direction is a direction parallel to mounting surface 33, and a direction approaching center line $O_1$ of socket S.

On the other hand, when moving from the second position to the first position, holding member 51 moves in the direction opposite to the first moving direction (also referred to as the second moving direction). The second moving direction is a direction parallel to mounting surface 33 and a direction away from center line $O_1$ of socket S.

Holding member 51 includes inner corner portion 510 facing the corner portion of IC package 6, and outer corner portion 511 that is a corner portion opposite inner corner portion 510.

Holding member 51 includes first side 512 and second side 513 orthogonal to first side 512. First side 512 and second side 513 are connected via inner corner portion 510.

Holding member 51 includes engagement portion 514 that is engageable with IC package 6. In the present embodiment, engagement portion 514 is disposed on inner corner portion 510 of holding member 51. Specifically, engagement portion 514 has first engagement surface 515 and second engagement surface 516.

First engagement surface 515 is a surface parallel to the side surface of the corner portion of IC package 6. In the present embodiment, first engagement surface 515 is an L-shaped surface along the side surface of IC package 6. Specifically, first engagement surface 515 is composed of a first surface that is parallel to the vertical direction and extends in a first direction (in the X direction in the present embodiment) and a second surface that is parallel to the vertical direction and extends in a second direction (in the Y direction in the present embodiment) that is orthogonal to the first direction.

In the holding state, such a first engagement surface 515 pushes the corner portion of IC package 6 in a direction parallel to mounting surface 33. In the holding state, first engagement surface 515 is engaged with the corner portion of IC package 6 in the X and Y directions. Therefore, in the holding state, first engagement surface 515 restricts the movement of IC package 6 in the direction parallel to mounting surface 33.

Second engagement surface 516 is an L-shaped surface connected to the upper end portion of first engagement surface 515 and extending along the upper surface of the corner portion of IC package 6. Specifically, second engagement surface 516 is composed of a first surface that faces downward and extends in the first direction (X direction in the present embodiment) and a second surface that faces downward and extends in the second direction (Y direction in the present embodiment) that is orthogonal to the first direction.

In the holding state, such a second engagement surface 516 covers the upper surface of the corner portion of IC package 6. Second engagement surface 516 may or does not have to make contact with the top surface of the corner portion of IC package 6 in the holding state.

In the holding state, second engagement surface 516 and the upper surface of the corner portion of IC package 6 face each other in the Z direction. In the holding state, such a second engagement surface 516 restricts the movement of IC package 6 in the vertical direction.

Holding member 51 includes elastic member placement portion 517 in which first elastic members 52a and 52b are disposed. In the case of the present embodiment, elastic member placement portion 517 is disposed in outer corner portion 511.

Specifically, elastic member placement portion 517 includes a pair of cutout portions 518a and 518b formed in outer corner portion 511. The bottom portions of the pair of cutout portions 518a and 518b make contact with first end portions 521 of first elastic members 52a and 52b, respectively.

The bottom portions of the pair of cutout portions 518a and 518b face receiving surfaces 414a and 414b of third housing portions 413a and 413b of vertical wall portion 4 described above.

Holding member 51 has first cam surface 519a. In the present embodiment, first cam surface 519a is disposed on first side 512. First cam surface 519a has the shape of a partially cylindrical surface that becomes away from first side 512 toward the lower side. First cam surface 519a faces cam surface 531c of trigger member 53a described later in the vertical direction.

Holding member 51 has second cam surface 519b. In the present embodiment, second cam surface 519b is disposed on second side 513. Second cam surface 519b has a partially cylindrical surface shape that becomes away from second side 513 toward the lower side. Second cam surface 519b faces cam surface 531c of trigger member 53b described later in the vertical direction.

<First Elastic Member>

Each of first elastic members 52a and 52b is a coil spring, and is disposed in elastic member placement portion 517 of holding member 51.

Each of first elastic members 52a and 52b has first end portion 521 and second end portion 522. First end portion 521 of first elastic member 52a makes contact with the bottom portion of cutout portion 518a of holding member 51. First end portion 521 of first elastic member 52b makes contact with the bottom portion of cutout portion 518b of holding member 51.

Second end portion 522 of first elastic member 52b makes contact with receiving surface 414a of third housing portion 413a in vertical wall portion 4. Second end portion 522 of first elastic member 52b makes contact with receiving surface 414b of third housing portion 413b in vertical wall portion 4.

Each of first elastic members 52a and 52b is contracted in the non-holding state. Therefore, first elastic members 52a and 52b apply elastic forces to holding member 51 in the direction indicated by arrow $A_1$ in FIG. 3A (the first moving direction) in the non-holding state. On the other hand, each of first elastic members 52a and 52b is in the free state in the holding state.

The number of first elastic members is not limited to that of the present embodiment. The number of first elastic members may be one, three, or more.

<Trigger Member>

Trigger members 53a and 53b are disposed respectively on trigger holding portions 306a and 306b of plate portion 3 to be vertically movable.

Each of trigger members 53a and 53b includes cam portion 531, upper shaft portion 532, and lower shaft portions 533a and 533b.

Cam portion 531 has upper surface 531a, lower surface 531b, and cam surface 531c. Cam surface 531c is disposed on a first end portion of cam portion 531, and is an inclined surface connecting upper surface 531a and lower surface 531b. The first end portion of cam portion 531 is an end portion on the side close to holding member 51.

Cam surface 531c is inclined to be away from the center of cam portion 531 toward the lower side. Cam surface 531c of trigger member 53a faces first cam surface 519a of holding member 51 in the vertical direction. Cam surface 531c of trigger member 53b faces second cam surface 519b of holding member 51 in the vertical direction.

Upper shaft portion 532 corresponds to one example of a protrusion, and is disposed on upper surface 531a of cam portion 531. Upper shaft portion 532 has a cylindrical shape extending upward from upper surface 531a.

Upper shaft portion 532 of trigger member 53a is inserted into through hole 415a in vertical wall portion 4. In the non-holding state, the upper end portion of upper shaft portion 532 of trigger member 53a protrudes upward from through hole 415a in vertical wall portion 4.

Upper shaft portion 532 of trigger member 53b is inserted into through hole 415b in vertical wall portion 4. In the non-holding state, the upper end portion of upper shaft portion 532 of trigger member 53b protrudes upward from through hole 415b in vertical wall portion 4.

Lower shaft portions 533a and 533b are disposed on lower surface 531b of cam portion 531. Each of lower shaft portions 533a and 533b has a cylindrical shape extending downward from lower surface 531b. Lower shaft portions 533a and 533b are inserted into second elastic members 54a and 54b, respectively.

The number of trigger members is not limited to that in the present embodiment. The number of trigger members may be one, three, or more.

<Second Elastic Member>

Each of second elastic members 54a and 54b corresponds to one example of the first biasing member, and is a coil spring. Each of second elastic members 54a and 54b has first end portion 541 and second end portion 542. First end portion 541 is an upper end portion. Second end portion 542 is a lower end portion.

Second elastic member 54a is disposed to surround lower shaft portion 533a of each of trigger members 53a and 53b. Second elastic member 54b is disposed to surround lower shaft portion 533b of each of trigger members 53a and 53b.

First end portions 541 of second elastic members 54a and 54b make contact with lower surfaces 531b of cam portions 531. Second end portions 542 of second elastic members 54a and 54b make contact with the bottom portions of recesses 304a and 304b in trigger holding portion 306a.

Second elastic members 54a and 54b are contracted by a predetermined amount in the non-holding state. Therefore, each of second elastic members 54a and 54b applies an upward elastic force to cam portion 531 in the non-holding state.

Based on this elastic force, cam surface 531c of cam portion 531 of trigger member 53a pushes first cam surface 519a of holding member 51 upward. Further, based on the elastic force, cam surface 531c of cam portion 531 of trigger member 53b pushes second cam surface 519b of holding member 51 upward.

Each of second elastic members 54a and 54b is contracted more in the holding state than in the non-holding state. Therefore, each of second elastic members 54a and 54b applies, to cam portion 531, an elastic force greater in the holding state than in the non-holding state.

The number of second elastic members is not limited to that in the case of the present embodiment. The number of second elastic members may be one, three, or more.

<Summary of Trigger Member>

In the case of trigger members 53a and 53b having the configuration as described above, the tip portion of upper shaft portion 532 protrudes above the upper surface of vertical wall portion 4 in the non-holding state. In the non-holding state, cam surface 531c of cam portion 531 of trigger member 53a pushes first cam surface 519a of holding member 51 upward.

In the non-holding state, cam surface 531c of cam portion 531 of trigger member 53b pushes second cam surface 519b of holding member 51 upward.

Here, a force by which cam surface 531c of cam portion 531 of trigger member 53a pushes first cam surface 519a of holding member 51 upward is referred to as a first pushing force. Further, a force by which cam surface 531c of cam portion 531 of trigger member 53b pushes second cam surface 519b of holding member 51 upward is referred to as a second pushing force.

In the non-holding state, holding member 51 is pushed by first elastic members 52a and 52b in the direction indicated by arrow $A_1$ in FIG. 3A (the first moving direction). However, in the non-holding state, the movement of holding member 51 in the first moving direction is restricted by a component of the first pushing force in the direction parallel to mounting surface 33 and a component of the second pushing force in the direction parallel to mounting surface 33.

<Operation of Socket>

Referring to FIGS. 3A, 3B, and 8 to 11, the operation of socket S (holding mechanisms 5) will be described below.

Figure 3B:
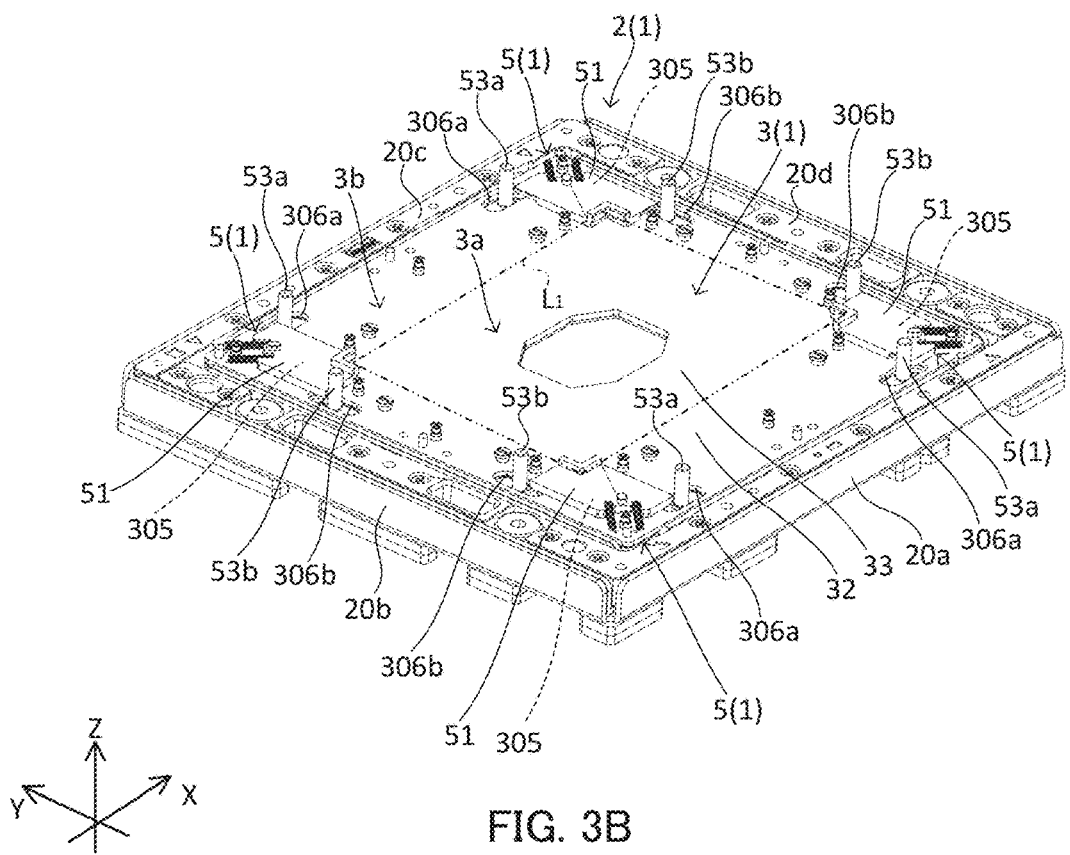
FIG. 3B is a perspective view of the socket corresponding to a holding state, in which illustration of the vertical wall portion is omitted.
Figure 4:
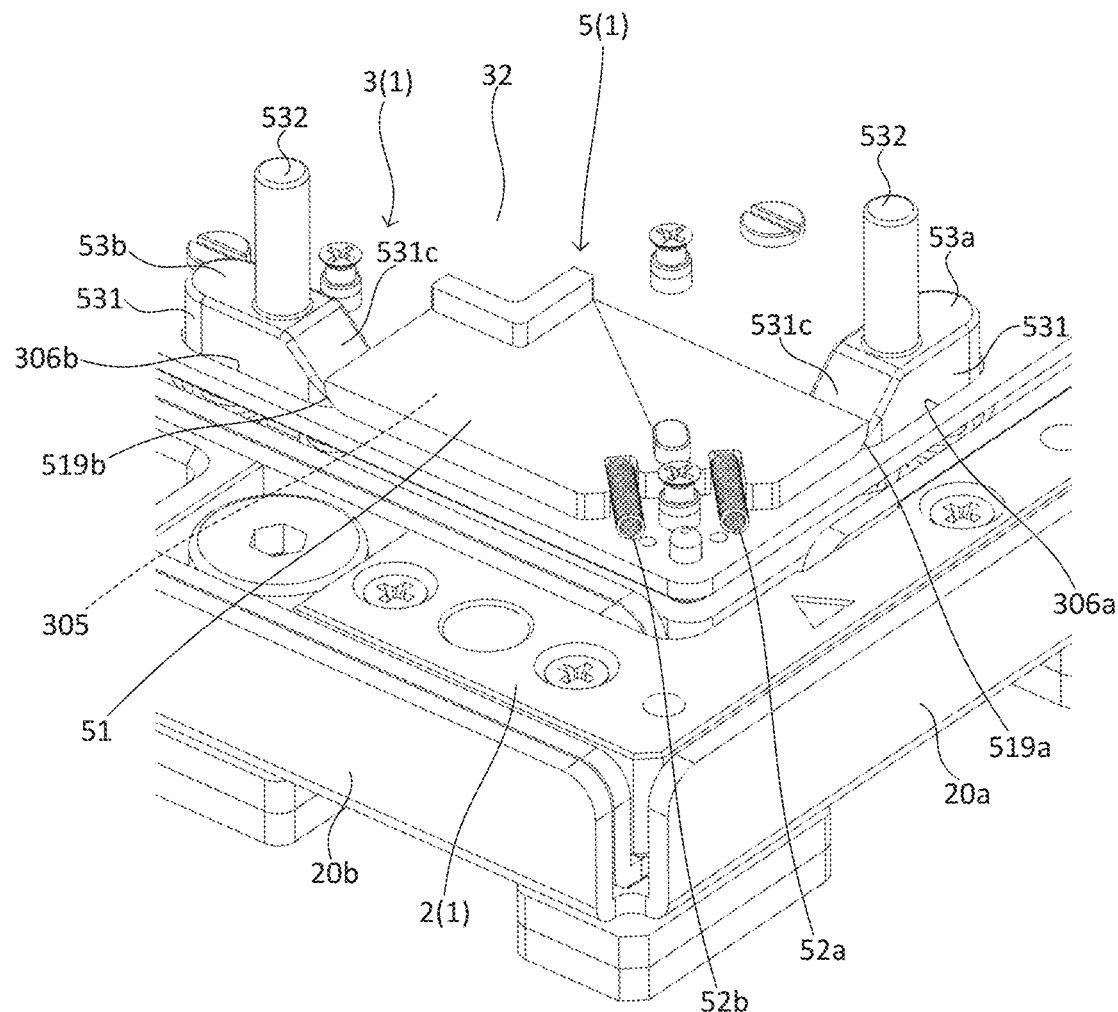
FIG. 4 is an enlarged view of an $X_1$ portion in FIG. 3A.
Figure 4:
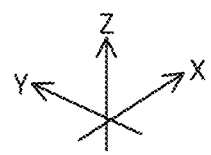
Figure 10:
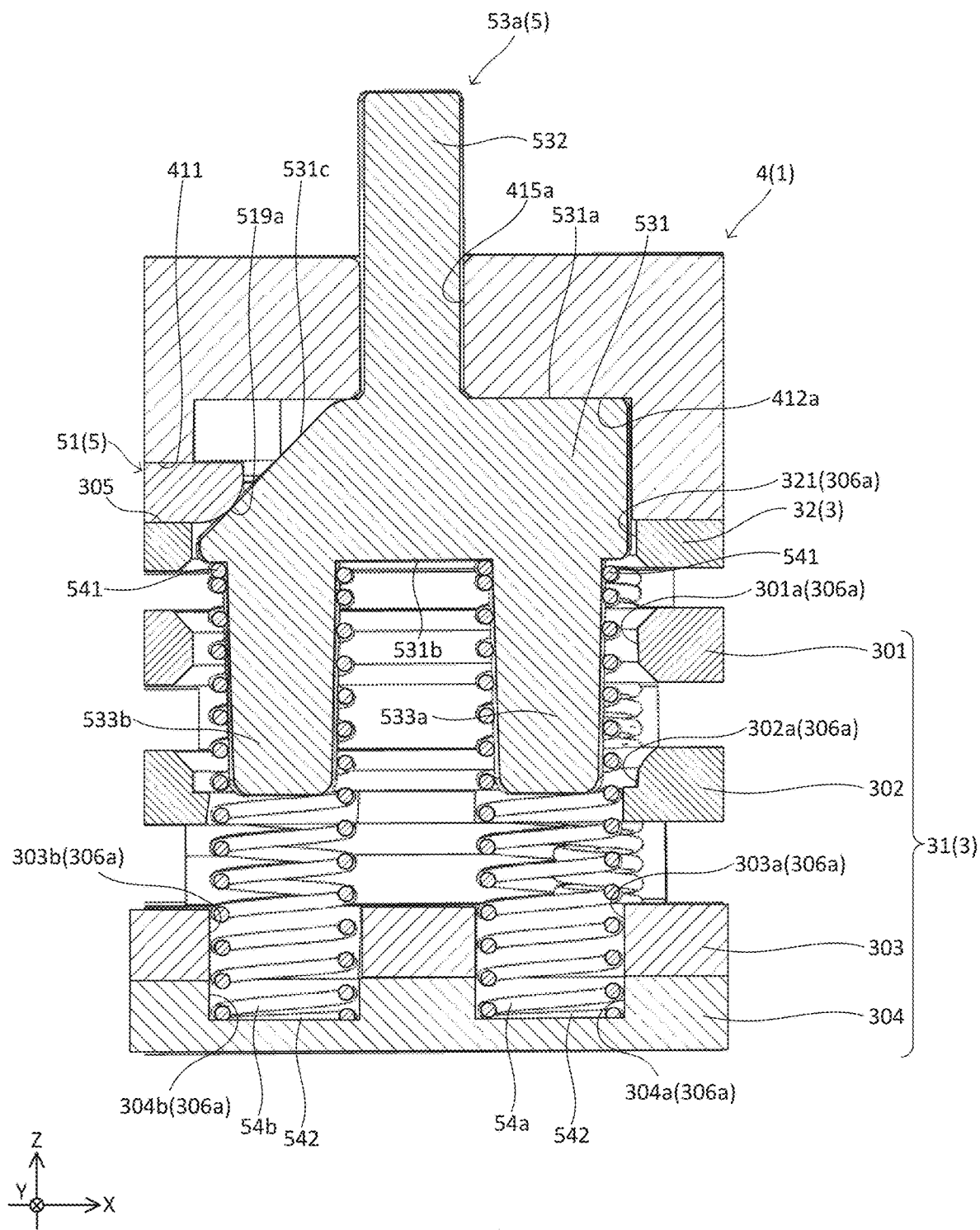
FIG. 10 is an A-A sectional view of the socket along line A-A in FIG. 2 corresponding to the non-holding state.

FIGS. 3A, 8, and 10 illustrate the state of the socket corresponding to the non-holding state. In addition, FIGS. 3B, 9, and 11 illustrate the state of the socket corresponding to the holding state.

To begin with, as illustrated in FIG. 8, IC package 6 is placed on mounting surface 33 of plate portion 3. In this state, IC package 6 is not pressed by pressing member 81. Pressing member 81 is disposed above IC package 6. This state is referred to as a first state of the socket and the pressing member (hereinafter, simply referred to as "first state").

When pressing member 81 approaches socket S in the first state from above, a part of pressing member 81 comes into contact with the upper end portions of upper shaft portions 532 of trigger members 53a and 53b of holding mechanisms 5 at predetermined positions (hereinafter, referred to as "first predetermined positions"). This state is referred to as a second state of the socket and the pressing member (hereinafter, simply referred to as "second state").

Note that, the positions of trigger members 53a and 53b in the first state and the second state (positions illustrated in FIG. 10) correspond to one example of the first position of the trigger part. In the present embodiment, the first position of the trigger part is at the upper end of a movement stroke of each of trigger members 53a and 53b in the vertical direction.

When pressing member 81 is moved further downward from the second state, trigger members 53a and 53b are moved downward together with pressing member 81. At this time, trigger members 53a and 53b move downward against the elastic force of second elastic members 54a and 54b. As a result, second elastic members 54a and 54b are contracted.

When trigger members 53a and 53b move downward, cam surfaces 531c of trigger members 53a and 53b also move downward. That is, cam surfaces 531c of trigger members 53a and 53b move in directions away from first cam surface 519a and second cam surface 519b of holding members 51.

Then, holding members 51 move in the direction indicated by arrow $A_1$ in FIG. 3A (first moving direction) based on the elastic force of first elastic members 52a and 52b. Then, as illustrated in FIGS. 3B and 9, holding members 51 move in the first moving direction until engagement portions 514 (specifically, first engagement surfaces 515) are engaged with the corner portions of IC package 6. This state is referred to as "third state" (hereinafter, simply referred to as "third state") of the socket and the pressing member.

When pressing member 81 is moved to the lower end, trigger members 53a and 53b are moved to positions at the lower end of the movement stroke in the vertical direction (see FIG. 11). The positions of trigger members 53a and 53b in the third state (position illustrated in FIG. 11) correspond to one example of the second position of the trigger part. In the present embodiment, the second position of the trigger part is at the lower end of the movement stroke of trigger members 53a and 53b in the vertical direction.

Then, holding mechanisms 5 enter the holding state. In a state where pressing member 81 is moved to the lower end, IC package 6 is in the pressed state of being pressed downward by pressing member 81.

In the holding state, gaps 55 of predetermined distance L in the vertical direction exist between, on one hand, cam surfaces 531c of trigger members 53a and 53b and, on the other hand, first cam surfaces 519a and second cam surfaces 519b of holding member 51.

In the holding state, trigger members 53a and 53b are pushed upward by second elastic members 54a and 54b.

Next, the operation of holding mechanisms 5 performed when pressing member 81 is moved upward from the pressed state and the pressed state is released will be described.

As pressing member 81 moves upward, trigger members 53a and 53b move upward based on the upward elastic force applied by second elastic members 54a and 54b. Here, cam surfaces 531c of trigger members 53a and 53b do not immediately make contact with first cam surfaces 519a and second cam surfaces 519b of holding members 51 because of the presence of gaps 55.

In the case of the present embodiment, the length of each of gaps 55 in the vertical direction is greater than the amount of movement of pressing member 81 performed until the pressing surface (lower surface) of pressing member 81 is separated from the pressed surface (upper surface) of IC package 6 after pressing member 81 starts moving upward from the pressed state.

Therefore, when the pressing surface (lower surface) of pressing member 81 is separated from the pressed surface (upper surface) of IC package 6, IC package 6 is held in socket body 1 by holding mechanisms 5. Therefore, it is ensured that the pressing surface (lower surface) of pressing member 81 is separated from the pressed surface (upper surface) of IC package 6.

Thereafter, when pressing member 81 moves upward by a predetermined distance from the pressed state (holding state), gaps 55 are eliminated, and cam surfaces 531c of trigger members 53a and 53b come into contact with first cam surfaces 519a and second cam surfaces 519b of holding members 51. The first predetermined distance is equal to the length of gap 55 in the vertical direction.

Then, when pressing member 81 moves further upward, holding members 51 move in the second moving direction which is the opposite direction to the direction indicated by arrow $A_1$ in FIG. 3A (first moving direction), based on the components in the direction parallel to mounting surface 33 of the first pushing force and the second pushing force applied by cam surfaces 531c of trigger members 53a and 53b to first cam surfaces 519a and second cam surfaces 519b of holding members 51.

As a result, the engagement between engagement portions 514 of holding members 51 (specifically, first engagement surfaces 515) and the corner portions of IC package 6 is released, and the non-holding state results. Thus, when pressing member 81 is separated by a predetermined distance away from the position corresponding to the pressed state, the engagement between engagement portions 514 of holdings member 51 and IC package 6 is released, and the non-holding state results.

<Action and Effect>

As described above, in the case of socket S according to the present embodiment, when the pressing surface (lower surface) of pressing member 81 is separated from the pressed surface (upper surface) of IC package 6, IC package 6 is still held by holding mechanisms 5 in socket body 1. Therefore, it is ensured that the pressing surface (lower surface) of pressing member 81 is separated from the pressing surface (upper surface) of IC package 6. Therefore, the work of peeling IC package 6 from the pressing surface of pressing member 81 is not required. As a result, the work efficiency of the performance test can be improved.

In the case of socket S according to the present embodiment, each of holding mechanisms 5 includes two trigger members 53a and 53b. Such a holding mechanism 5 does not transition from the non-holding state to the holding state unless two trigger members 53a and 53b move downward.

That is, even when only one of two trigger members 53a and 53b moves downward, the holding mechanism does not operate. Such a configuration contributes to suppression of erroneous operation of the holding mechanism due to erroneous manipulation.

The disclosure of Japanese Patent Application No. 2020-7599 dated Jan. 21, 2020 including the specification, drawings and abstract is incorporated herein by reference in its entirety.

INDUSTRIAL APPLICABILITY

The present invention can be applied to a socket for connecting various electrical components.

REFERENCE SIGNS LIST

S Socket
1 Socket body
2 Sidewall portion
20a First wall portion
20b Second wall portion
20c Third wall portion
20d Fourth wall portion
3 Plate portion
3a First region
3b Second region
31 Fixed portion
301 First plate
301a Through hole
302 Second plate
302a Through hole
303 Third plate
303a, 303b Through hole
304 Fourth plate
304a, 304b Recess
305 Placement surface
306a, 306b Trigger holding portion
32 Movable portion
321 Through hole
33 Mounting surface
4 Vertical wall portion
41 Housing portion
411 First housing portion
412a, 412b Second housing portion
413a, 413b Third housing portion
414a, 414b Receiving surface
415a, 415b Through hole
5 Holding mechanism
51 Holding member
510 Inner corner portion
511 Outer corner portion
512 First side
513 Second side
514 Engagement portion
515 First engagement surface
516 Second engagement surface
517 Elastic member placement portion
518a, 518b Cutout portion
519a First cam surface
519b Second cam surface
52a, 52b First elastic member
521 First end portion
522 Second end portion
53a, 53b Trigger member
531 Cam portion
531a Upper surface
531b Lower surface
531c Cam surface
532 Upper shaft portion
533a, 533b Lower shaft portion
54a, 54b Second elastic member
541 First end portion
542 Second end portion
55 Gap
6 IC package
7 Inspection board
8 Pressing device
81 Pressing member

What is claimed is:

1. A socket for electrically connecting a first electrical component to a second electrical component, the first electrical component being pressed at an upper surface of the first electrical component by a pressing member capable of moving upward and downward, the second electrical component being disposed below the first electrical component, the socket comprising:
a socket body comprising a mounting surface on which the first electrical component is to be placed;
a holding part that is disposed on the socket body and that, in a pressed state in which the first electrical component is pressed by the pressing member, is engaged with the first electrical component to hold the first electrical component, and releases engagement with the first electrical component when the pressing member is separated by a predetermined distance away from a position corresponding to the pressed state;
a trigger part configured to move downward from a first position to a second position based on a pressing force to allow the holding part to be engaged with the first electric component when the pressing member moves downward, and configured to move upward from the second position to the first position based on a biasing force to release engagement between the holding part and the first electrical component;
a biasing member comprising a spring configured to constantly provide the biasing force to the trigger part; and
an elastic member comprising a spring configured to provide an elastic force to the holding part, the elastic force being for moving the first electric component in a predetermined direction toward a center of the first electric component, wherein
the trigger part comprises:
a columnar portion extending in a vertical direction and configured to receive the pressing force at an upper part thereof; and
a cam portion disposed to connect to a lower part of the columnar portion and operable to be in contact with and separated from the holding part along with upward and downward movement of the holding part such that the cam portion does not regulate movement of the holding part in the predetermined direction based on the elastic force when the cam portion is separated from the holding part and the cam portion regulates movement of the holding part in the predetermined direction based on the elastic force when the cam portion is in contact with the holding part,
the cam portion is positioned below the holding part with a gap from the holding part in a state where the trigger part is positioned at the second position, and
a length of the gap in the vertical direction is greater than an amount of movement of the pressing member until the pressing member is separated from the upper surface of the first electric component after the pressing member starts moving upward from the pressing state.

2. The socket according to claim 1, wherein:
the holding part has an engagement surface parallel to a side surface of the first electrical component, and
the engagement surface pushes the first electrical component in a direction parallel to the mounting surface in the pressed state.

3. The socket according to claim 2, wherein:
at least one pair of the holding parts are disposed on the socket body opposite each other across the mounting surface, and
in the pressed state, the first electrical component is clamped by the engagement surfaces of the at least one pair of holding parts.

4. The socket according to claim 3, wherein:
the at least one pair of holding parts are disposed at positions corresponding to four corners of the mounting surface having a rectangular shape and, in the pressed state, push four corners of the first electrical component in the predetermined direction,
each of the engagement surfaces has a first surface and a second surface orthogonal to each other, and
the first surface and the second surface make contact with a pair of side surfaces of the first electrical component connected at each of the four corners of the first electrical component in the pressed state.

5. The socket according to claim 1, wherein:
the holding part is configured to move in a direction parallel to the mounting surface based on contact with the cam portion to be separated from the first electric component.

6. The socket according to claim 1, wherein:
the trigger part comprises at least two trigger parts, and
the holding part releases engagement with the first electrical component when each of the at least two trigger parts move from the first position to the second position by being pushed by the pressing member.

* * * * *